(12) United States Patent
Haiberger (10) Patent No.: US 11,482,512 B2
(45) Date of Patent: Oct. 25, 2022

(54) OPTOELECTRONIC COMPONENT, OPTOELECTRONIC DEVICE, FLASHLIGHT AND HEADLIGHT

(71) Applicant: OSRAM Opto Semiconductors GmbH, Regensburg (DE)

(72) Inventor: Luca Haiberger, Regensburg (DE)

(73) Assignee: OSRAM OLED GmbH, Regensburg (DE)

(*) Notice: Subject to any disclaimer, the term of this patent is extended or adjusted under 35 U.S.C. 154(b) by 84 days.

(21) Appl. No.: 16/279,108

(22) Filed: Feb. 19, 2019

(65) Prior Publication Data

US 2019/0259738 A1    Aug. 22, 2019

(30) Foreign Application Priority Data

Feb. 19, 2018    (DE) ...................... 10 2018 103 604.3

(51) Int. Cl.
| | |
|---|---|
| *H01L 25/16* | (2006.01) |
| *H01L 33/36* | (2010.01) |
| *H01L 23/31* | (2006.01) |

(52) U.S. Cl.
CPC ........ *H01L 25/167* (2013.01); *H01L 23/3114* (2013.01); *H01L 33/36* (2013.01)

(58) Field of Classification Search
CPC ... H01L 25/167; H01L 23/3114; H01L 33/36; H01L 25/075; H01L 33/50; H01L 33/58;
(Continued)

(56) References Cited

U.S. PATENT DOCUMENTS 10,698,265 B1 *   6/2020   Steinhagen ............. G02F 1/157
2002/0145792 A1   10/2002  Jacobson et al.
(Continued)

FOREIGN PATENT DOCUMENTS

| CN | 103838062 A   | 6/2014 |
|----|---------------|--------|
| CN | 106479478 A * | 3/2017 |
| EP | 2 225 781 B1  | 9/2010 |

OTHER PUBLICATIONS

Ting Xu et al., "High-contrast and fast electrochromic switching enabled by plasmonics," Nature Communications, vol. 7, Jan. 27, 2016, pp. 1-6.
(Continued)

*Primary Examiner* — Thao X Le
*Assistant Examiner* — Laura M Dykes
(74) *Attorney, Agent, or Firm* — DLA Piper LLP (US)

(57) ABSTRACT

An optoelectronic component includes an optoelectronic semiconductor chip that generates primary radiation during intended operation of the semiconductor chip, which primary radiation is coupled out via an emission side of the semiconductor chip, an optical element on the emission side and including a plurality of transmission fields arranged laterally side by side, wherein each transmission field is individually and independently electrically controllable, the transmission fields each include an electrochromic material, the transmission fields are such that, by electrically driving a transmission field, the transmittance of the electrochromic material for a radiation coming from the direction of the semiconductor chip during operation is changed and transmittance of the optical element in the region of the respective transmission field is changed for the respective radiation.

16 Claims, 3 Drawing Sheets

(58) Field of Classification Search
CPC ... F21S 41/153; F21S 41/663; G02F 2201/44; G02F 1/157; G03B 15/05
USPC .......................................................... 257/99
See application file for complete search history.

(56) References Cited

U.S. PATENT DOCUMENTS

| | | | |
|---|---|---|---|
| 2012/0091923 A1* | 4/2012 | Kastner-Jung | G04C 19/02 315/360 |
| 2013/0021561 A1* | 1/2013 | Ahn | G02F 1/1347 349/77 |
| 2015/0131139 A1* | 5/2015 | Tsukamoto | G02B 5/1828 359/266 |
| 2015/0176777 A1 | 6/2015 | Hikmet et al. | |
| 2016/0351755 A1* | 12/2016 | Lee | H01L 33/56 |

OTHER PUBLICATIONS

Ki Ryong Jeong et al., "Enhanced black state induced by spatial silver nanoparticles in an electrochromic device," NPG Asia Materials, vol. 9, Mar. 17, 2017, pp. 1-8.

* cited by examiner

OPTOELECTRONIC COMPONENT, OPTOELECTRONIC DEVICE, FLASHLIGHT AND HEADLIGHT

TECHNICAL FIELD

This disclosure relates to an optoelectronic component, an optoelectronic device, a flashlight and a headlamp.

BACKGROUND

There is a need to provide an optoelectronic component with a pixelated luminous surface as well as an optoelectronic device, a flashlight and a headlamp with such an optoelectronic component.

SUMMARY

I provide an optoelectronic component including an optoelectronic semiconductor chip that generates primary radiation during intended operation of the semiconductor chip, which primary radiation is coupled out via an emission side of the semiconductor chip, an optical element on the emission side and comprising a plurality of transmission fields arranged laterally side by side, wherein each transmission field is individually and independently electrically controllable, the transmission fields each include an electrochromic material, the transmission fields are such that, by electrically driving a transmission field, the transmittance of the electrochromic material for a radiation coming from the direction of the semiconductor chip during operation is changed and transmittance of the optical element in the region of the respective transmission field is changed for the respective radiation.

I also provide the optoelectronic component including an optoelectronic semiconductor chip that generates primary radiation during intended operation of the semiconductor chip, which primary radiation is coupled out via an emission side of the semiconductor chip, an optical element on the emission side and comprising a plurality of transmission fields arranged laterally side by side, wherein each transmission field is individually and independently electrically controllable, the transmission fields each include an electrochromic material, the transmission fields are such that, by electrically driving a transmission field, the transmittance of the electrochromic material for a radiation coming from the direction of the semiconductor chip during operation is changed and transmittance of the optical element in the region of the respective transmission field is changed for the respective radiation, wherein the transmission fields can each be switched between at least two operating modes by electrical control, and in a first operating mode, the transmission degree of the optical element in a region of at least one transmission field is at least twice as large as in a second operating mode, wherein the transmission fields can be switched to a third operating mode, in the second operating mode of the respective transmission field, the optical element is reflective in the region of the transmission field for the radiation coming from a direction of the semiconductor chip, and in the third operating mode of the respective transmission field, the optical element is absorbent in the region of the transmission field for the radiation coming from the direction of the semiconductor chip.

I further provide an optoelectronic device including the optoelectronic component including an optoelectronic semiconductor chip that generates primary radiation during intended operation of the semiconductor chip, which primary radiation is coupled out via an emission side of the semiconductor chip, an optical element on the emission side and comprising a plurality of transmission fields arranged laterally side by side, wherein each transmission field is individually and independently electrically controllable, the transmission fields each include an electrochromic material, the transmission fields are such that, by electrically driving a transmission field, the transmittance of the electrochromic material for a radiation coming from the direction of the semiconductor chip during operation is changed and transmittance of the optical element in the region of the respective transmission field is changed for the respective radiation, and a controller configured to control the individual transmission fields of the optoelectronic component individually and independently of one another.

I also further provide a flashlight including the optoelectronic component including an optoelectronic semiconductor chip that generates primary radiation during intended operation of the semiconductor chip, which primary radiation is coupled out via an emission side of the semiconductor chip, an optical element on the emission side and comprising a plurality of transmission fields arranged laterally side by side, wherein each transmission field is individually and independently electrically controllable, the transmission fields each include an electrochromic material, the transmission fields are such that, by electrically driving a transmission field, the transmittance of the electrochromic material for a radiation coming from the direction of the semiconductor chip during operation is changed and transmittance of the optical element in the region of the respective transmission field is changed for the respective radiation, and an optical system arranged downstream of the optoelectronic component in a radiation direction, the optical system is configured for at least one of deflecting and collimating the radiation emitted from the optoelectronic component.

LIST OF REFERENCE SIGNS

1 semiconductor chip
2 optical element
3 conversion element
4 control unit
5 carrier
10 emission side
20 transmission field
21 electrochromic material
22 first electrode
23 second electrode
100 optoelectronic component
220 slot in the first electrode 22

DETAILED DESCRIPTION

My optoelectronic component may comprise an optoelectronic semiconductor chip. The optoelectronic semiconductor chip may generate primary radiation during intended operation. The primary radiation may be decoupled via an emission side of the semiconductor chip.

The optoelectronic semiconductor chip comprises a semiconductor layer sequence with an active layer that generates electromagnetic radiation. The semiconductor layer sequence is, for example, based on a III-V compound semiconductor material. For example, the semiconductor material is a nitride compound semiconductor material such as $Al_nIn_{1-n-m}Ga_mN$, or a phosphide compound semiconductor material such as $Al_nIn_{1-n-m}Ga_mP$, or an arsenide compound semiconductor material such as $Al_nIn_{1-n-m}Ga_mAs$ or $Al_nIn_{1-n-m}Ga_mAsP$, where 0 is $\leq n \leq 1$, $0 \leq m \leq 1$ and $m+n \leq 1$, respectively. The semiconductor layer sequence may contain dopants as well as additional components. For the sake of simplicity, however, only the essential components of the crystal lattice of the semiconductor layer sequence, that is Al, As, Ga, In, N or P, are mentioned, even if these may be partially replaced and/or supplemented by small quantities of other substances. The semiconductor layer sequence is preferably based on AlInGaN.

The active layer of the semiconductor layer sequence contains in particular at least one pn junction and/or at least one quantum well structure and can, for example, generate electromagnetic primary radiation in the blue or green or red spectral range or in the UV range during intended operation. The semiconductor chip preferentially comprises one active layer, in particular exactly one continuous layer, in particular one single layer. Alternatively, the active layer can also be segmented.

A semiconductor chip is an element that can be handled and electrically contacted separately. A semiconductor chip is created by separation from a wafer composite. Side surfaces of such a semiconductor chip then show traces from the separation process of the wafer compound, for example. A semiconductor chip preferably comprises exactly one originally contiguous area of the semiconductor layer sequence grown in the wafer composite. The semiconductor layer sequence of the semiconductor chip is preferably formed contiguously. For example, the lateral expansion of the semiconductor chip measured parallel to the principal direction of expansion of the active layer is not more than 1% or not more than 5% greater than the lateral expansion of the active layer or the semiconductor layer sequence. For example, the semiconductor chip also includes the growth substrate on which the entire semiconductor layer sequence has been grown.

The semiconductor chip can be a so-called volume emitter, in particular a flip chip. In this example, the semiconductor chip also preferentially includes the growth substrate, which is formed from sapphire, for example. Alternatively, the semiconductor chip can also be a surface emitter, in particular a so-called thin-film chip. In this example, for example, the growth substrate is detached.

During specified normal operation, at least 50% or at least 75% or at least 90% of the primary radiation decoupled from the semiconductor chip is preferably decoupled via the emission side. The emission side, for example, extends essentially parallel to a main plane of expansion of the semiconductor chip.

The optoelectronic component may comprise an optical element on the emission side. During operation, for example, at least 75% of the radiation emitted from the emission side may hit the optical element. The optical element may be configured so that radiation coming from the direction of the semiconductor chip passes through the optical element and then leaves the component. The optical element is in particular a disk.

The optical element, for example, is a constituent of the optoelectronic component manufactured separately from the semiconductor chip. The optical element may be located directly or indirectly on the emission side or at a distance from the emission side.

The optical element may comprise a plurality of transmission fields arranged laterally side by side. A lateral direction is a direction parallel to the main plane of extension of the semiconductor chip and/or parallel to the emission side. The transmission fields can be arranged in a matrix pattern. Each transmission field forms a pixel of the optical element. The optical element thus comprises a plurality of pixels.

For example, the optical element comprises at least 100 or at least 500 or at least 1000 such transmission fields. Seen in a plan view, each transmission field is, for example, square or rectangular. For example, edge lengths of each transmission field are 10 μm to 500 μm, preferably 50 μm to 200 μm.

A lateral extent of the optical element, for example, deviates from a lateral extent of the semiconductor chip by no more than 50% or no more than 20%.

Each transmission field can be electrically controlled individually and independently of the other transmission fields. The respective transmission field can be activated or deactivated by electrically controlling the transmission field. In particular, an electric voltage applied to the transmission field or an electric current flowing through the transmission field can be controlled.

The transmission fields may each comprise an electrochromic material. Electrochromic materials may be materials that reversibly change an optical property by applying an electric field or by a current flow due to a redox reaction, for example. In particular, the transmission fields comprise an electrochromic material which, when an electric field is applied or due to a current flow, changes its transmittance for radiation coming from the direction of the semiconductor chip during operation.

The electrochromic material may, for example, be a transition metal oxide such as tungsten oxide or molybdenum oxide, or a conductive polymer such as 3,4-polyethylenedioxythiophene, PEDOT for short, or polyaniline, or poly(2,2-dimethyl-3,4-propylenedioxythiophene). Silver nanoparticles are also suitable as electrochromic material.

The transmission fields may be such that by electrically controlling a transmission field, the degree of transmission of the electrochromic material for a radiation coming from the direction of the semiconductor chip during operation is changed, thereby changing the degree of transmission of the optical element in the region of the respective transmission field for the radiation.

In other words, the transmission fields form areas of the optical element through which radiation from the semiconductor chip passes before the radiation leaves the component. By electrically controlling a transmission field, the proportion of radiation passing through the transmission field can be changed. Since each transmission field can be electrically controlled individually and independently of one another, a pixelated component is thus realized, whereby for each pixel individually and independently of the other pixels it can be adjusted how much radiation of the component passes through and leaves the component. A change in the transmittance of the respective transmission field is particularly preferably achieved solely by changing the optical property of the electrochromic material.

The radiation coming from the direction of the optoelectronic component is, for example, the primary radiation of the semiconductor chip or secondary radiation obtained by conversion of the primary radiation or a mixture of the primary radiation and the secondary radiation.

The optoelectronic component, for example, is a light-emitting diode.

The optoelectronic component may comprise an optoelectronic semiconductor chip that, when the semiconductor chip is operated as intended, generates primary radiation coupled out via an emission side of the semiconductor chip. The component may also include an optical element on the emission side. The optical element may comprise a plurality of transmission fields arranged laterally side by side. Each transmission field may be electrically controllable individually and independently of the other transmission fields. The transmission fields may each comprise an electrochromic material. The transmission fields may be configured such that by electrically controlling a transmission field, the degree of transmission of the electrochromic material for radiation coming from the direction of the semiconductor chip during operation is changed, thereby changing the degree of transmission of the optical element in the area of the transmission field for this radiation.

Some applications require optoelectronic components with a pixelated luminous surface. To realize such pixelated optoelectronic components, many small semiconductor chips can be placed next to each other on a substrate. Each semiconductor chip then corresponds to one pixel of the component. The minimum distance between the semiconductor chips is limited by the application process. In addition, a relatively high assembly effort is required so that such a component is expensive.

Another approach is to use a monolithic semiconductor chip that is itself pixelated, i.e., has a plurality of pixels. However, this requires a relatively complicated chip architecture and the use of expensive technologies.

However, I provide a pixelated component in which the individual pixels are not predetermined by different semiconductor chips or by a segmentation of a semiconductor chip. Instead, a separate pixelated optical element is applied to a simple semiconductor chip. The optical element comprises a plurality of pixels each formed by a transmission field of the optical element. The transmission fields in turn comprise an electrochromic material, the degree of transmission of which can be regulated by electrical control. Depending on how a transmission field is controlled, the transmission field is more or less transparent to the electromagnetic radiation coming from the direction of the semiconductor chip.

The above-mentioned disadvantages of using several semiconductor chips or a pixelated semiconductor chip can thus be avoided.

An optoelectronic component can be used in particular in a flashlight, for example, a camera, or headlamp, for example, of a motor vehicle.

The transmission fields can be switched between at least two operating modes by electrical control. In the two operating modes, the transmittance of the radiation coming from the direction of the semiconductor chip through the transmission field can vary. In the two operating modes, for example, different voltages are applied or different currents are passed through the electrochromic material.

In a first mode of operation, the transmittance of the optical element in the region of a transmission field may be at least twice or at least four times or at least ten times or at least 20 times as great as in a second mode of operation. For example, in the first mode of operation, the transmittance is at least 50% or at least 70% or at least 80% or at least 90%. In the second mode of operation, for example, the transmittance may be not more than 50% or not more than 30% or not more than 20% or not more than 10%. The transmittance is given in particular for the wavelength at which the radiation coming from the direction of the semiconductor chip has a maximum intensity.

The transmission fields may be dimmable so that the degree of transmission of a specific transmission field can be adjusted continuously or steplessly between the degrees of transmission of the two operating modes. For example, by continuously changing an electric field or an electric current in the electrochromic material, the degree of transmission of the electrochromic material can be continuously changed.

Each transmission field may comprise a first electrode and a second electrode between which the electrochromic material is disposed. For example, the first electrode forms an anode, the second electrode a cathode, or vice versa. In particular, the electrodes are in direct contact with the electrochromic material.

Each transmission field can have its own first electrode and/or its own second electrode unambiguously assigned to it. Alternatively, it is also possible that several transmission fields, in particular all transmission fields, share the first or second electrode. The first and/or second electrode may include or consist of a metal such as Au, Ag, Al, Ti. One or both electrodes may comprise or consist of a transparent conductive oxide such as indium tin oxide, ITO for short.

For example, the electrodes are stacked one above the other in a direction perpendicular to the emission side. For example, the first electrode is located between the second electrode and the emission side, or the second electrode is located between the emission side and the first electrode.

The first electrode of at least one transmission field may comprise a plurality of slots partially filled with the electrochromic material. For example, the first electrode has at least 10 or at least 100 such slots.

The slots partially or completely penetrate the first electrode. For example, a depth of each slot is at least 50% or at least 75% of the total thickness of the first electrode. The depth of a slit is the expansion of the slit perpendicular to a main plane of extension of the first electrode. In other words, the slots extend perpendicularly or transversely to a main plane of extension of the first electrode. The main plane of extension of the first electrode preferably runs parallel to the emission side of the semiconductor chip.

For example, the first electrode has a total thickness of at least 100 nm or at least 200 nm or at least 250 nm. Alternatively or additionally, the total thickness of the first electrode may be not more than 500 nm or not more than 300 nm. The total thickness is understood in particular as the mean or maximum thickness of the first electrode.

The electrochromic material is preferably formed as a layer between the first electrode and the second electrode. The layer of electrochromic material forms a surface structure of the first electrode, in particular the slots, with a positive fit. In particular, the layer of electrochromic material covers the walls formed by the first electrode and extending transversely or perpendicularly to the main plane of extension of the first electrode in the region of the slots. On the first electrode, especially in the area of the slots, the layer of electrochromic material has a layer thickness of 3 nm to 50 nm. A layer of the second electrode is preferably arranged between opposing walls of the first electrode in the region of a slot and between the layers of electrochromic material applied thereto.

A segmented electrode with slots as specified above has proven advantageous in reducing the switching times of the electrochromic material. The particularly thin layer of the electrochromic material leads to a short switching time. Nevertheless, the optical absorption can be high. Light incident on the electrochromic material is coupled to surface plasmon polaritons traveling as surface waves along the surface of the first electrode and as guided modes in the slots. The effective optical thickness for the transmission of radiation is thus approximately the depth of the slits. This means that by using a slotted first electrode, the optical thickness of the electrochromic material can be greater than the actual thickness.

For further details, reference is made to Ting Xu et al., High-contrast and fast electrochromic switching enabled by plasmonics, Nature Communication, January 2016, the subject matter of which is incorporated herein by reference.

The slots may each have a depth of at least 100 nm or at least 150 nm or at least 200 nm. Alternatively or additionally, the depth of each slot may not exceed 500 nm or 400 nm or 300 nm.

The slots may be at least 10 nm wide or at least 30 nm wide or at least 50 nm wide. Alternatively or additionally, the width of each slot may not exceed 100 nm or 80 nm or 70 nm. The width of a slot is defined as the distance between opposite walls of the first electrode in the area of a slot, in particular.

A layer thickness of the electrochromic material between the two electrodes may be at least 1 nm or at least 4 nm or at least 5 nm. Alternatively or additionally, the layer thickness shall not exceed 50 nm or 40 nm or 25 nm. In particular, the layer of electrochromic material has a constant thickness within manufacturing tolerances, for example, with maximum deviations of 25%, over its entire expansion.

The thicknesses or widths or depths can be understood as maximum, minimum or medium thicknesses or widths or depths.

Several slots may run essentially parallel to each other. 'Essentially parallel' means parallel within manufacturing tolerances.

A distance between two adjacent parallel slots may be at least 200 nm or at least 300 nm or at least 400 nm. Alternatively or additionally, a distance between two adjacent parallel slots may be not more than 1000 nm or not more than 800 nm or not more than 600 nm.

Examples of the structure of the first electrode of a transmission field have been described. If each transmission field comprises its own first electrode, then several or all of these first electrodes can be constructed in this way, i.e., in particular can comprise a plurality of slots. If, however, several first transmission fields share a common first electrode, the first electrode can be constructed in the area of several or all respective transmission fields as described above, i.e., in particular it can comprise a plurality of slots in the area of the respective transmission fields.

Each transmission field may be uniquely assigned its own first electrode and/or its own second electrode. In this example, the first and/or second electrodes of adjacent transmission fields are preferably spaced apart and not connected. The size of a transmission field or a pixel is defined in particular by the size of an electrode specifically assigned to this transmission field.

Several or all transmission fields may share a common first or second electrode. In this example, the first or second electrode, for example, is a continuous layer that extends over a plurality or all of the transmission fields.

The electrochromic material of several or all transmission fields may form a continuous layer. This means that the electrochromic material is continuously formed between adjacent transmission fields and is not interrupted.

Several or all transmission fields may comprise a separate layer of the electrochromic material. The layers of the electrochromic material of adjacent transmission fields need not connect and are preferably spaced apart. In other words, the electrochromic material is segmented according to the transmission fields. This can further increase the contrast between adjacent pixels.

The semiconductor chip itself need not be pixelated. In particular, the semiconductor may chip comprise exactly one simply connected active layer. Furthermore, the semiconductor chip preferably comprises only one cathode and only one anode for electrical contacting of the semiconductor chip.

A conversion element may be arranged between the optical element and the emission side. During operation the conversion element may convert at least part of the primary radiation into secondary radiation. The conversion element can partially or completely convert the primary radiation decoupled from the emission side. The conversion element may include, for example, a matrix material such as siloxane or silicone or epoxy in which fluorescent particles are embedded. The conversion element may be in direct contact with the semiconductor chip and/or optical element. For example, the conversion element covers at least 75% of the emission side of the semiconductor chip. The conversion element preferably extends as a continuous layer over a plurality of transmission fields.

At least some transmission fields, preferably all transmission fields, may overlap completely with the emission side in plan view on the emission side.

The optical element may be arranged such that, in the second mode of operation of a transmission field, the optical element in the region of this transmission field is reflective or specular to the radiation coming from the direction of the semiconductor chip. For example, the reflectance is then at least 65% or at least 75% or at least 80% or at least 85%. The degree of reflection is given in particular for the wavelength at which the radiation coming from the direction of the semiconductor chip has a maximum intensity.

During operation, radiation that strikes a transmission field in the second operating mode is reflected back into the semiconductor chip or back into the conversion element and is therefore not lost.

Reflective properties of a transmission field can be achieved, for example, by using metal nanoparticles, especially silver nanoparticles, as electrochromic material. Further details can be found, for example, in Ki Ryong Jeong et al., *Enhanced black state induced by spatial silver nanoparticles in an electrochromic device*, NPG Asia Materials, 2017, the subject matter of which is incorporated herein by reference.

The optical element may be arranged such that, in the second mode of operation of a specific transmission field, the optical element in the region of this transmission field absorbs the radiation coming from the direction of the semiconductor chip. For example, the degree of absorption shall be at least 70% or at least 80% or at least 90% or at least 95%. For an observer, for example, the corresponding transmission field is black. The degree of absorption is given in particular for the wavelength at which the radiation coming from the direction of the semiconductor chip has a maximum intensity.

A particularly high degree of absorption can, for example, be achieved with silver nanoparticles as electrochromic material. If an ITO electrode with 3D ITO nano-branches is used, which, for example, are self-assembled and grown in an electron beam evaporator, the Ag nanoparticles can be distributed in the branches of the ITO nanowires when a voltage is applied to the electrodes, resulting in a particularly high absorption of radiation. Details of how a corresponding structure is realized are again revealed in Ki Ryong Jeong et al.

The transmission fields can also be switched to a third operating mode. For example, in the second and third operating modes, the polarity of the voltage applied to the electrodes is reversed. In the first operating mode, for example, no voltage or a lower voltage is applied to the electrodes.

In the second mode of operation of a transmission field, the optical element in the region of this transmission field may be reflective for the radiation coming from the direction of the semiconductor chip. In the third operating mode of a transmission field, the optical element in the region of this transmission field absorbs the radiation coming from the direction of the semiconductor chip. This can be achieved by using silver nanoparticles as electrochromic material, which is placed between two ITO electrodes. One ITO electrode is provided without 3D ITO nanowires so that its surface is smooth. The other electrode is provided with 3D ITO nanowires so its surface is very rough. Depending on the polarity of the electrodes, the Ag nanoparticles migrate to either the flat or the rough electrode. At the flat electrode, the Ag nanoparticles have a highly reflective or reflecting effect, at the rough electrode they have a highly absorbing effect. Details are again revealed in Ki Ryong Jeong et al.

I also provide an optoelectronic device. The optoelectronic device comprises an optoelectronic component according to one or more of the previous examples.

The optoelectronic device may further comprise a control unit configured to control the individual transmission fields of the optoelectronic component individually and independently. For example, the control unit may include a microcontroller. The control unit and the optoelectronic component may be mounted on a common support.

I further provide a flashlight. The flashlight comprises an optoelectronic component or an optoelectronic device according to one or more of the previous examples. The flashlight is especially a flashlight for a camera such as a digital camera, especially for smartphones.

I still further provide a headlamp. The headlamp shall comprise an optoelectronic component or optoelectronic device conforming to one or more of the previous examples. The headlamp can be used, for example, in a motor vehicle such as a passenger car or a truck. Such a headlamp is particularly suitable as a front headlamp.

In the optoelectronic device, the headlamp and the flashlight, an optical system that deflects and/or collimates the radiation emitted from the optoelectronic component may be arranged downstream of the optoelectronic component in a radiation direction. The optical system includes, for example, one or more lenses and/or one or more mirrors or a reflector.

In the following, an optoelectronic component as well as an optoelectronic device, a flashlight and a headlight are explained in more detail with reference to drawings on the basis of examples. Same reference signs indicate the same elements in the individual figures. However, there are no references to scale shown, rather individual elements may be exaggerated large for a better understanding.

Figure 1:
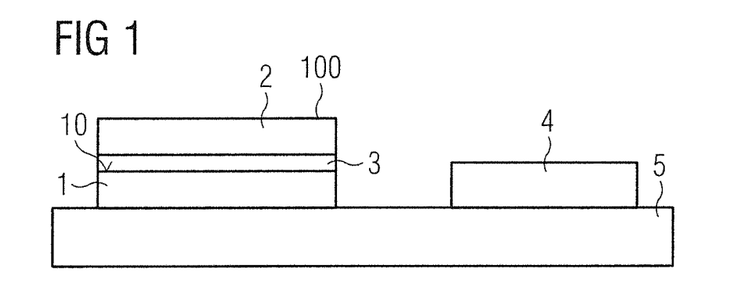
FIG. 1 shows an example of the optoelectronic device in a cross-sectional view.

FIG. 1 shows an example of the optoelectronic device in cross-sectional view. The device comprises an optoelectronic component 100, which is mounted on a carrier 5 such as a printed circuit board. The component 100 comprises a semiconductor chip 1 with an emission side 10. During normal operation, the semiconductor chip 1 emits electromagnetic primary radiation, for example, in the blue spectral range or in the UV range. For example, at least 90% of the primary radiation decoupled from semiconductor chip 1 is decoupled via emission side 10.

The semiconductor chip 1 is, for example, a GaN-based thin-film chip. The semiconductor chip 1 is not pixelated. For example, the semiconductor chip 1 comprises only a single, continuous active layer.

A conversion element 3 is mounted on the emission side 10. The conversion element 3 comprises fluorescent particles embedded in a matrix material such as silicone, for example. At least 75% of the emission side 10 is covered by the conversion element 3. The conversion element 3 is configured to convert at least part of the primary radiation into secondary radiation of a different wavelength range. The resulting radiation is, for example, visible light, especially white light.

The conversion element 3 is followed by an optical element 2. The optical element 2 also covers at least 75% of the emission side 10. The optical element 2 is arranged such that it only allows the electromagnetic radiation coming from the direction of the semiconductor chip 1 to pass through in certain, predefinable areas. In other words, the transmittance of the optical element 2 for radiation coming from the direction of the semiconductor chip 1 can be controlled pixel-fine.

A control unit 4 is provided on a carrier 5 for the electrical control of the optical element 2. The control unit 4, for example, is a microcontroller.

Figure 2:
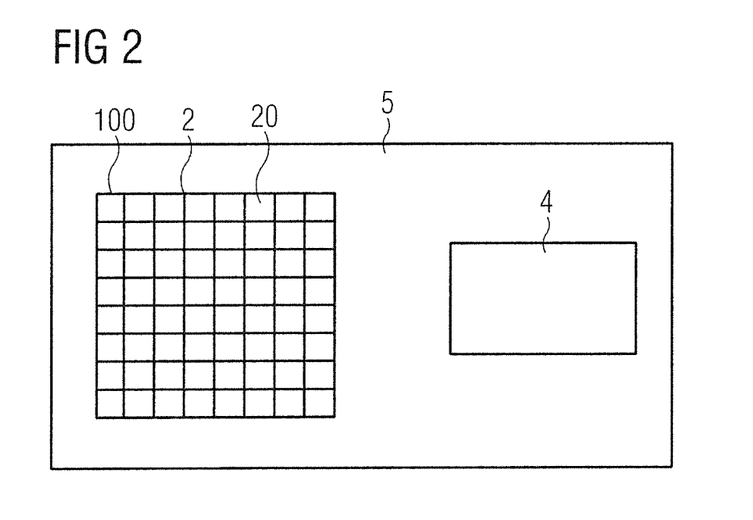
FIG. 2 shows an example of the optoelectronic device in plan view.

FIG. 2 shows a top view of the optoelectronic device of FIG. 1. In particular, it can be seen that the optical element 2 comprises a plurality of transmission fields 20, each of which realizes a pixel of the optical element 2 and of the component 100, respectively. The transmission fields 20 can be controlled individually and independently of each other, whereby the degree of transmission is controlled by the optical element 2 in the range of these transmission fields 20.

Figure 3A:
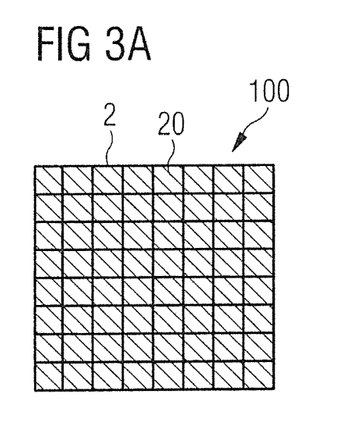
FIGS. 3A and 3B show an example of the optoelectronic component in plan view and in different operating states.
Figure 3B:
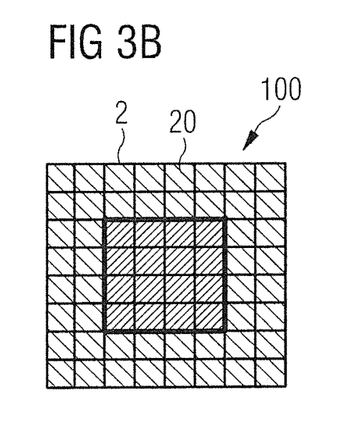

FIGS. 3A and 3B show two operating states of an example of the optoelectronic component 100. In FIG. 3A, all transmission fields 20 are activated or operated in a first operating mode, whereby in the area of all transmission fields 20 the radiation coming from the direction of the semiconductor chip 1 passes through the optical element 2.

In FIG. 3B, only transmission fields 20 arranged in a central region are controlled in the first operating mode. Marginal transmission fields 20 are driven in a second operating mode in which the transmittance through the optical element 2 in the region of these transmission fields 20 is lower, for example, at most ¼ of the transmittance of the first operating mode.

The optoelectronic component 100 thus creates a pixelated light surface that can be used, for example, in a flashlight for cameras or smartphones, or in a headlight, for example, for motor vehicles.

Figure 4A:
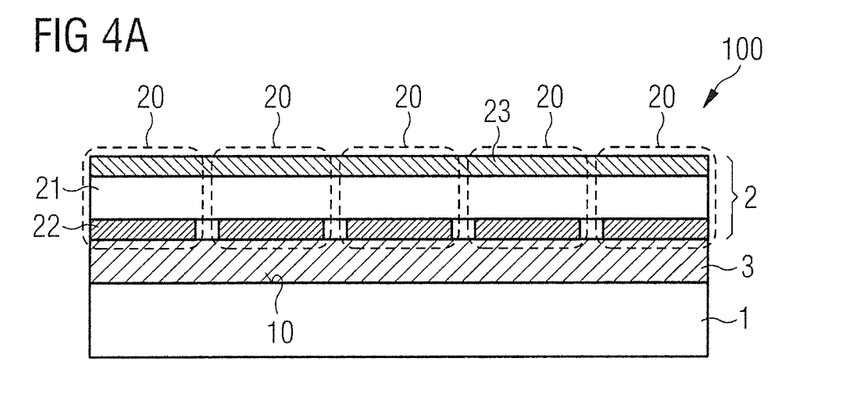
FIGS. 4A and 4B show examples of the optoelectronic component in cross-sectional view.

FIG. 4A shows an example of the optoelectronic component 100 in a detailed crosssectional view. It can be seen that the optical element 2 is laterally divided into a plurality of transmission fields 20. Each transmission field 20 comprises a first electrode 22 and a second electrode 23. Each transmission field 20 has its own first electrode 22 uniquely assigned to it. In contrast, the transmission fields 20 share a common second electrode 23. The electrodes 22, 23 are based, for example, on a metal or on a transparent conductive oxide such as ITO.

An electrochromic material 21 such as PEDOT is arranged between the two electrodes 22, 23. In this example, the electrochromic material 21 forms a continuous layer extending over a plurality of the transmission fields 20.

By applying a voltage between one of the first electrodes 22 and the second electrode 23 creates an electric field or current flow in the electrochromic material 21 of the respective transmission field 20. This changes the transmittance of the electrochromic material 21 for radiation coming from the direction of the semiconductor chip 1.

Figure 4B:
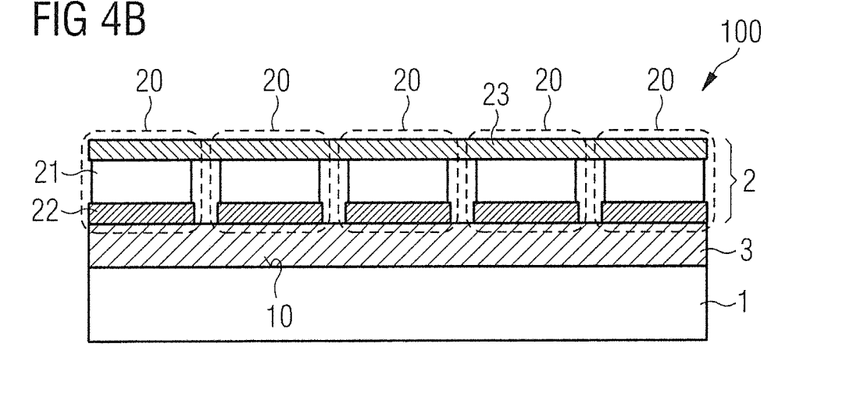

FIG. 4B shows another example of the component 100 in cross-sectional view. Unlike in FIG. 4A, the electrochromic material 21 between the electrodes 22, 23 does not pass as a continuous layer over a plurality of the transmission fields 20, but the electrochromic material 21 is segmented and interrupted in a lateral direction so that each transmission field 20 comprises its own layer of electrochromic material 21.

Figure 5:
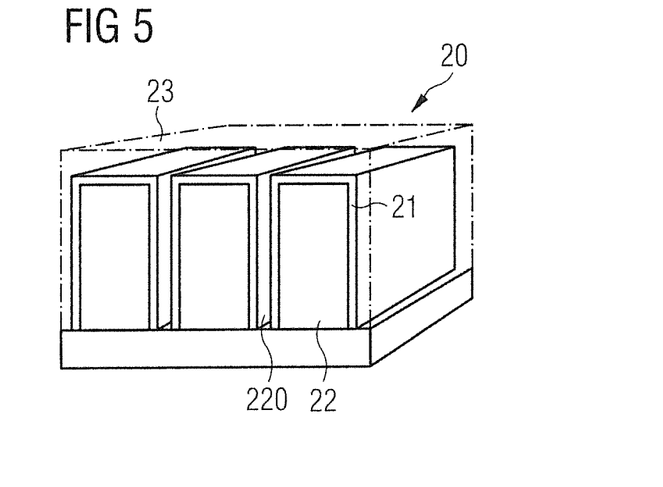
FIG. 5 shows an example of a transmission field in perspective view. \

FIG. 5 shows a detailed view of an example of a transmission field 20. The first electrode 22 comprises several slots 220. For example, a thickness of the first electrode 22 is approximately 250 nm, with the slots 220 completely penetrating the first electrode 22 along the thickness. A width of the slots 220, for example, is about 60 nm each. The first electrode 22, for example, is made of gold.

The layer of electrochromic material 21 is applied to the first electrode 22, also in the area of the slots 220. For example, the thickness of the layer of electrochromic material 21 is 5 nm to 25 nm.

The second electrode 23 is applied to the layer of electrochromic material 21. The second electrode 23 also fills the areas between the opposing electrochromic material 21 in the slots 220.

The segmented design of the first electrode 22 allows the switching times for changing the transmittance of the electrochromic material 21 to be reduced, while at the same time achieving a large change in transmittance.

Figure 6:
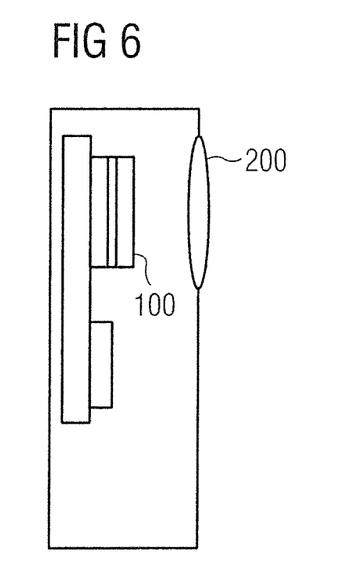
FIG. 6 shows an example of the flashlight.

FIG. 6 shows an example of the flashlight. The optoelectronic component 100 is followed in the beam direction by an optical system 200 in the form of a lens 200. The flashlight can, for example, be integrated into a camera such as a smartphone.

Figure 7:
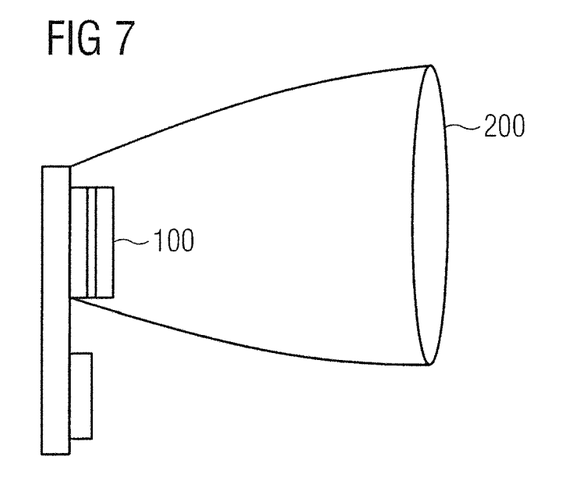
FIG. 7 shows an example of the headlight.

FIG. 7 shows an example of a headlight. The optoelectronic component 100 is followed by an optical system 200 comprising a reflector and a lens. Such a headlamp can be used as a front headlamp in a passenger car, for example.

My components, devices, flashlights and headlights are not limited by the description using the examples. Rather, this disclosure includes any new feature and any combination of features, which in particular includes any combination of features in the appended claims, even if the features or combination itself are not explicitly mentioned in the claims or in examples.

This application claims priority of DE 10 2018 103 604.3, the subject matter of which is incorporated herein by reference.

The invention claimed is:

1. An optoelectronic component comprising:
a single optoelectronic semiconductor chip that generates primary radiation during intended operation of the semiconductor chip, which primary radiation is coupled out via an emission side of the semiconductor chip,
an optical element on the emission side and comprising a plurality of transmission fields arranged laterally side by side, wherein
each transmission field is 1) individually and independently electrically controllable, and 2) assigned to the emission side of the single optoelectronic semiconductor chip,
the transmission fields each comprise an electrochromic material,
the transmission fields are such that, by electrically driving a transmission field, the transmittance of the electrochromic material for a radiation coming from the direction of the semiconductor chip during operation is changed and transmittance of the optical element in the region of the respective transmission field is changed for the respective radiation,
the transmission fields comprise metal nanoparticles,
the transmission fields can each be switched between at least two operating modes by electrical control,
the optical element is configured such that, in the second operating mode of the respective transmission field, the optical element is reflective in the region of the transmission field for the radiation from a direction of the semiconductor chip, and
at least 75% of the primary radiation decoupled from the semiconductor chip is decoupled via the emission side.

2. The optoelectronic component according to claim 1, wherein
in a first operating mode, the transmission degree of the optical element in a region of at least one transmission field is at least twice as large as in a second operating mode.

3. The optoelectronic component according to claim 2, wherein the transmission fields are dimmable such that the transmittance of the respective transmission field is continuously adjustable between the transmittances of the two modes of operation.

4. The optoelectronic component according to claim 2, wherein
the transmission fields can be switched to a third operating mode,
in the second operating mode of the respective transmission field, the optical element is reflective in the region of the transmission field for the radiation coming from a direction of the semiconductor chip, and
in the third operating mode of the respective transmission field, the optical element is absorbent in the region of the transmission field for the radiation coming from the direction of the semiconductor chip.

5. The optoelectronic component according to claim 1, wherein
each transmission field comprises a first electrode and a second electrode between which the electrochromic material is disposed, and
the first electrode of at least one transmission field comprises a plurality of slots partially filled with the electrochromic material.

6. The optoelectronic component according to claim 5, wherein
the slots each have a depth of 100 nm to 500 nm,
the slots each have a width of 10 nm to 100 nm, and
a layer thickness of the electrochromic material, in an area between the two electrodes, is 1 nm to 50 nm.

7. The optoelectronic component according to claim 5, wherein
a plurality of the slots extend substantially parallel to each other, and a distance between two adjacent parallel slots is 200 nm to 1000 nm.

8. The optoelectronic component according to claim 5, wherein each transmission field being uniquely assigned at least one of its own first electrode and its own second electrode.

9. The optoelectronic component according to claim 1, wherein the electrochromic material of a plurality of the transmission fields forms a continuous layer.

10. The optoelectronic component according to claim 1, wherein at least some of the transmission fields each comprises a separate layer of the electrochromic material, the separate layers of the electrochromic material of adjacent transmission fields being spaced apart from one another.

11. The optoelectronic component according to claim 1, wherein the semiconductor chip itself is not pixelated.

12. The optoelectronic component according to claim 1, wherein a conversion element is arranged between the optical element and the emission side and the conversion element is configured to convert at least part of the primary radiation into secondary radiation during operation.

13. The optoelectronic component according to claim 1, wherein, when viewed from above onto the emission side, at least some of the transmission fields completely overlap with the emission side.

14. An optoelectronic device comprising:
the optoelectronic component according to claim 1, and
a controller configured to control the individual transmission fields of the optoelectronic component individually and independently of one another.

15. A flashlight comprising:
the optoelectronic component according to claim 1,
an optical system arranged downstream of the optoelectronic component in a radiation direction, the optical system is configured for at least one of deflecting and collimating the radiation emitted from the optoelectronic component.

16. A headlamp comprising:
an optoelectronic component according to claim 1, and
an optical system arranged downstream of the optoelectronic component in a radiation direction, the optical system is configured for at least one of deflecting and collimating the radiation emitted from the optoelectronic component.

* * * * *